US007507783B2

(12) United States Patent
Meador et al.

(10) Patent No.: US 7,507,783 B2
(45) Date of Patent: Mar. 24, 2009

(54) THERMALLY CURABLE MIDDLE LAYER COMPRISING POLYHEDRAL OLIGOMERIC SILSESQUIOXANES FOR 193-NM TRILAYER RESIST PROCESS

(75) Inventors: Jim D. Meador, Manchester, MO (US); Mariya Nagatkina, Buffalo Grove, IL (US); Doug Holmes, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 10/784,045

(22) Filed: Feb. 20, 2004

(65) Prior Publication Data

US 2004/0229158 A1 Nov. 18, 2004

Related U.S. Application Data

(60) Provisional application No. 60/449,898, filed on Feb. 24, 2003.

(51) Int. Cl.
C08G 77/06 (2006.01)
(52) U.S. Cl. .............................. 528/28; 528/12; 528/21; 528/23; 528/32; 528/37; 526/279; 428/447
(58) Field of Classification Search ................... 528/32, 528/35, 37, 12, 21, 23, 28; 526/279; 428/447
See application file for complete search history.

(56) References Cited

U.S. PATENT DOCUMENTS

| | | | |
|---|---|---|---|
| 4,244,799 A | 1/1981 | Fraser et al. | |
| 4,891,303 A | 1/1990 | Garza et al. | |
| 5,126,231 A | 6/1992 | Levy | |
| 5,370,969 A | 12/1994 | Vidusek | |
| 5,484,867 A * | 1/1996 | Lichtenhan et al. | ............ 528/9 |
| 5,770,350 A | 6/1998 | Lee | |
| 5,925,578 A | 7/1999 | Bae | |
| 6,252,030 B1 * | 6/2001 | Zank et al. | ................... 528/31 |
| 6,420,084 B1 * | 7/2002 | Angelopoulos et al. | .. 430/270.1 |
| 6,420,088 B1 | 7/2002 | Angelopoulos et al. | |
| 6,586,548 B2 * | 7/2003 | Bonafini et al. | ............. 526/279 |
| 6,653,045 B2 * | 11/2003 | Angelopoulos et al. | .. 430/270.1 |
| 6,664,024 B1 * | 12/2003 | Nguyen et al. | ........... 430/280.1 |
| 6,730,454 B2 | 5/2004 | Pfeiffer et al. | |
| 6,803,171 B2 * | 10/2004 | Gronbeck et al. | ......... 430/270.1 |
| 6,916,543 B2 * | 7/2005 | De et al. | ...................... 428/447 |
| 7,041,748 B2 * | 5/2006 | Lin et al. | ..................... 525/474 |
| 2002/0182541 A1 * | 12/2002 | Gonsalves | ............... 430/287.1 |
| 2005/0031964 A1 * | 2/2005 | Babich et al. | ................... 430/5 |

OTHER PUBLICATIONS

J. Meador et al., "Recent Pogress in 193nm Antireflective Coatings," Proc. SPIE, 3678, p. 800, 1999.
J. Meador et al., "Improved Crosslinkable Polymeric Binders for 193-nm Bottom Antireflective Coatings (BARCs)," Proc. SPIE, 4345, p. 846, 2001.
K. Sho et al., "Material and Process Development for KrF Lithography Using Tri-level Resist Process," *Journal of Photopolymer Science and Technology* (Japan), vol. 14, No. 3 (2001), pp. 469-474.
Novembre, E. Reichmanis, et al., "Preparation and Lithographic Properties of Poly (Trimethysilymethyl Methacrylate-co-Chloromethyl Styrene)," SPIE vol. 631, *Advances in Resist Technology and Processing III* (1986), p. 14.
E. Tegou et al., "Polyhedral Oligomeric Silsesquioxane (POSS) Based Resist Materials for 157 nm Lithography," Proc. SPIE, 5039, p. 453, 2003.

* cited by examiner

*Primary Examiner*—Margaret G Moore
(74) *Attorney, Agent, or Firm*—Hovey Williams LLP

(57) ABSTRACT

New lithographic compositions (e.g., for use as middle layers in trilayer processes) are provided. In one embodiment, the compositions comprise an organo-silicon polymer dispersed or dissolved in a solvent system, and preferably a crosslinking agent and a catalyst. In another embodiment, the organo-silicon polymer is replaced with a polyhedral oligomeric silsesquioxane-containing polymer and/or a polyhedral oligomeric silsesquioxane. In either embodiment, the polymer and/or compound should also include —OH groups for proper cross-linking of the composition. When used as middle layers, these compositions can be applied as very thin films with a very thin layer of photoresist being applied to the top of the middle layer. Thus, the underlying bottom anti-reflective coating is still protected even though the overall stack (i.e., anti-reflective coating plus middle layer plus photoresist) is still thin compared to prior art stacks.

52 Claims, 6 Drawing Sheets

THERMALLY CURABLE MIDDLE LAYER COMPRISING POLYHEDRAL OLIGOMERIC SILSESQUIOXANES FOR 193-NM TRILAYER RESIST PROCESS

RELATED APPLICATIONS

This application claims the priority benefit of a provisional application entitled THERMALLY CURABLE MIDDLE LAYER FOR 193-NM TRILAYER RESIST PROCESS, Ser. No. 60/449,898, filed Feb. 24, 2003, incorporated by reference herein.

FEDERALLY SPONSORED RESEARCH/DEVELOPMENT PROGRAM

This invention was made with Government support under contracts DASG60-00-C-0044 and DASG60-01-0047, awarded by the United States Army Space and Missile Defense Command. The Government has certain rights in the invention.

BACKGROUND OF THE INVENTION

1. Field of the Invention

The present invention is broadly concerned with new compositions for use as middle layers in trilayer resist processes. The compositions include an organo-silicon polymer or a polyhedral oligomeric silsesquioxane-containing polymer or compound dissolved in a solvent system.

2. Description of the Prior Art

In order to store ever-increasing amounts of information on a substrate area, the microchip industry continues to move to shorter and shorter wavelengths of light for resist exposures. This trend towards decreasing linewidths leads to high aspect ratio lines, with the thin, tall lines tending to fall over during resist development/rinse steps. For 193-nm exposures, the microchip industry typically uses roughly 270-350 nm of resist on 32-80 nm of bottom anti-reflective coating—so-called unilayer processing. For trilayer applications, photoresist thicknesses (~150-200 nm) are much less than for unilayer applications, resulting in low aspect ratio lines. The trilayer bottom anti-reflective coating instead is 300-700 nm thick, and the middle layer is 30-215 (preferably 30-60) nm thick. The advantages of the trilayer resist processing include: (a) reduced resist aspect ratios; (b) the ability to use conventional or ultra-thin 193-nm photoresists rather than silicon-containing and hydrophobic (bilayer) resists; (c) minimized interaction of resist with the substrate; (d) optimum thickness control for the imaging, masking, and anti-reflective layer; and (e) improved depth-of-focus (DOF) since the trilayer bottom anti-reflective coatings are designed to be highly planarizing.

The key to trilayer imaging is a robust middle layer offering facile spin-applied processing, acceptable bottom anti-reflective coating/resist adhesion, excellent imageability, and outstanding etch selectivities to both bottom anti-reflective coating and resist. The middle layer must etch much slower than the bottom anti-reflective coating in an oxygen plasma and preferably faster than the photoresist in a fluorinated gas plasma. Prior approaches to the middle layer problem include the use of spin-on-glass, which requires careful attention to surface acidity in order to achieve acceptable adhesive properties.

SUMMARY OF THE INVENTION

The present invention is broadly concerned with new lithographic compositions and methods of using those compositions as middle or protective layers during circuit manufacturing.

In more detail, the compositions comprise a polymer or compound dispersed or dissolved in a solvent system. In one embodiment, that polymer is an organo-silicon polymer, preferably including recurring monomers having the formula

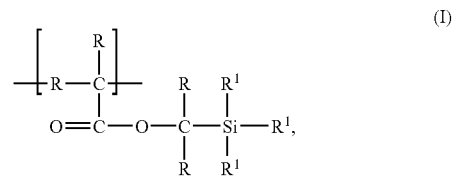

where:
each R is individually selected from the group consisting of hydrogen and alkyls (preferably $C_1$-$C_6$); and
each $R^1$ is individually selected from the group consisting of hydrogen, alkyls (preferably $C_1$-$C_{12}$, and more preferably $C_1$-$C_6$), and aryls (preferably $C_6$-$C_{18}$, and more preferably $C_6$-$C_{12}$).

The polymer of this embodiment preferably further comprises recurring monomers having an alcohol functionality. Preferred such monomers have the formula

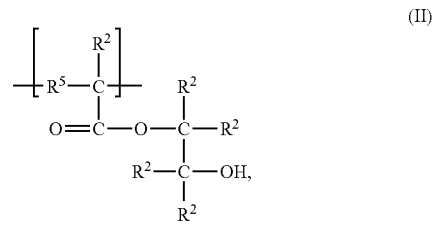

where: each $R^2$ is individually selected from the group consisting of hydrogen, alkyls (preferably $C_1$-$C_{12}$, and more preferably $C_1$-$C_6$), and aryls (preferably $C_6$-$C_{18}$, and more preferably $C_6$-$C_{12}$); and each $R^5$ is individually selected from the group consisting of alkyls (preferably $C_1$-$C_{12}$, and more preferably $C_1$-$C_6$), and aryls (preferably $C_6$-$C_{18}$, and more preferably $C_6$-$C_{12}$).

The molar ratio of (I) to (II) is preferably from about 80:20 to about 50:50, and more preferably from about 75:25 to about 60:40. The weight average molecular weight of this polymer is preferably from about 35,000-100,000 Daltons, and more preferably from about 74,000-97,000 Daltons. Particularly preferred polymers according to this embodiment include copolymers of trimethylsilylmethyl methacrylate and hydroxypropyl methacrylate, although hydroxyethyl acrylate and/or hydroxy ethyl methacrylate could serve as the alcohol constituent as well.

In another embodiment, the composition will include a polymer having recurring monomers of a polyhedral oligomeric silsesquioxane such as those commercialized by Hybrid Plastics under the name POSS®, and/or the composition will include polyhedral oligomeric silsesquioxane compounds. One such compound (or monomer as the case may be) has the formula

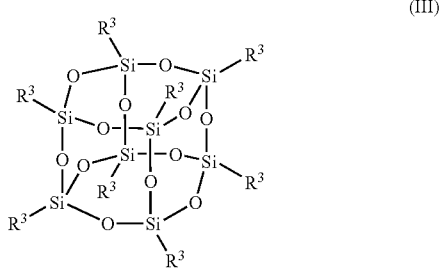

(III)

where each $R^3$ is individually selected from the group consisting of hydrogen, alkyls (preferably $C_1$-$C_{12}$, and more preferably $C_1$-$C_6$), aryls (preferably $C_6$-$C_{18}$, and more preferably $C_6$-$C_{12}$), hydroxypropyldimethylsilyloxy, and olefinic moieties.

One preferred (III) is a hydroxypropyldimethylsilyloxy compound having the formula

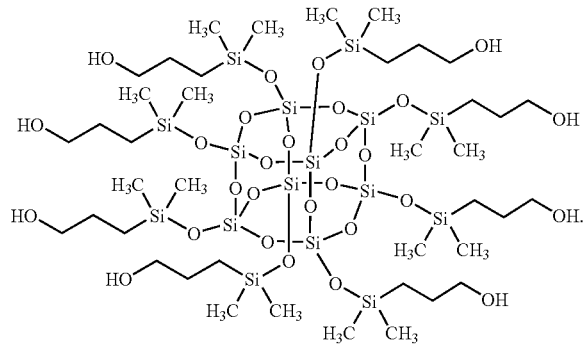

In embodiments where (III) is present as part of a polymer, the polymerization preferably takes place via an olefin group on $R^3$. Thus, at least one $R^3$ will include an olefinic moiety (such as in methacrylates or acrylates). In this embodiment, it is also preferred that at least one $R^3$ in (III) is

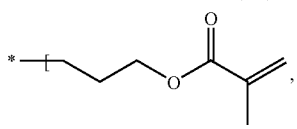

where "*" designates Si on (III).

As was the case with the organo-silicon polymer, it is preferred that the polymer or compound of this embodiment include alcohol functionality on the polyhedral oligomeric silsesquioxane and/or that the polymer further comprise recurring monomers having an alcohol functionality. One such preferred monomer has the formula

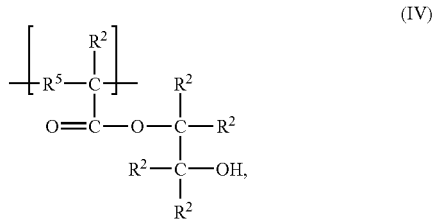

(IV)

where: each $R^2$ is individually selected from the group consisting of hydrogen, alkyls (preferably $C_1$-$C_{12}$, and more preferably $C_1$-$C_6$), and aryls (preferably $C_6$-$C_{18}$, and more preferably $C_6$-$C_{12}$); each $R^5$ is individually selected from the group consisting of alkyls (preferably $C_1$-$C_{12}$, and more preferably $C_1$-$C_6$, and aryls (preferably $C_6$-$C_{18}$, and more preferably $C_6$-$C_{12}$). The molar ratio of polyhedral oligomeric silsesquioxane to (IV) is preferably from about 15:85 to about 30:70, and more preferably from about 25:75 to about 20:80.

The inventive compositions generally have an overall solids content of from about 1.5-5.0% and can be prepared by simply dissolving or dispersing the polymer (and any other ingredients as discussed below) in a suitable solvent system. The solvent system should have a boiling point of from about 100-200° C., and preferably from about 120-170° C. The amount of polymer dissolved in the solvent system is from about 0.5-5.0% by weight polymer, preferably from about 1.0-4.0% by weight polymer, and more preferably from about 1.0-3.6% by weight polymer, based upon the total weight of the composition taken as 100% by weight.

The solvent system should be utilized at a level of from about 93-99.5% by weight, preferably from about 94-99% by weight, and more preferably from about 94-98.5% by weight, based upon the total weight of the composition taken as 100% by weight. Preferred solvent systems include a solvent selected from the group consisting of propylene glycol monomethyl ether (PGME), propylene glycol monomethyl ether acetate (PGMEA), ethyl lactate, propylene glycol n-propyl ether (PnP), cyclohexanone, tetrahydrofuran (THF), dimethyl formamide (DMF), γ-butyrolactone, 2-heptanone, N-methylpyrollidinone, and mixtures thereof.

Preferably, the inventive compositions further comprise a compound selected from the group consisting of crosslinking agents, catalysts, and mixtures thereof. Preferred crosslinking agents include those selected from the group consisting of aminoplast cross-linking agents (melamines, glycourils, etc., e.g., POWDERLINK 1174, Cymel® products). The crosslinking agent should be present in the composition at a level of from about 0.5-2.5% by weight, and preferably from about 0.5-1.5% by weight, based upon the total weight of the composition taken as 100% by weight. Thus, the compositions of the invention should crosslink at a temperature of from about 150-225° C., and more preferably from about 175-205° C.

Preferred catalysts include sulfonic acids (e.g., p-toluenesulfonic acid, styrene sulfonic acid), thermal acid generators (e.g., pyridinium tosylate), carboxylic acids (e.g., trichloroacetic acid, benzene tetracarboxylic acid), and mixtures thereof. The catalyst should be present in the composition at. a level of from about 0.1-1.0% by weight, and preferably from about 0.1-0.3% by weight, based upon the total weight of the composition taken as 100% by weight.

In a preferred embodiment, the compositions include a catalyst system comprising a weak acid as well as a low level of strong acid. Thus, the compositions would comprise less than about 1.0% by weight of a strong acid, preferably less than about 0.3% by weight of a strong acid, and more preferably less than about 0.1% by weight of a strong acid, based upon the total weight of the composition taken as 100% by weight. The weak acid would be present at a level of from about 0.02-1% by weight, more preferably from about 0.05-1% by weight, and even more preferably from about 0.05-0.5% by weight, based upon the total weight of the composition taken as 100% by weight. The weight ratio of strong acid to weak acid in the composition is from about 0:100 to about 50:50, preferably from about 5:95 to about 35:65, and more preferably about 2:98.

As used herein, the term "strong acid" is intended to refer to those compounds having a $pK_a$ of less than about −6.0 at 25° C. Examples of strong acids include p-toluenesulfonic acid, sulfuric acid, hydrochloric acid, hydrobromic acid, nitric acid, trifluoroacetic acid, and perchloric acid. As used herein, the term "weak acid" is intended to refer to those compounds having a $pK_a$ of greater than about 0, preferably from about 0-12, and more preferably from about 6-11 at 25° C. Preferred weak acids include phenolic compounds (including any phenolic compounds containing electron withdrawing groups, e.g., bis(4-hydroxyphenyl)sulfone or bisphenol S, bis(4-hydroxyphenyl)dimethylmethane or bisphenol A, α-cyano-4-hydroxycinnamic acid, phenol novolaks, benzenthiol, and phenols substituted with nitro groups, carbonyl groups, or carboxylic groups), carboxylic acids (e.g., acetic acid), and phosphoric acid.

The method of using the compositions simply comprises applying a quantity of a composition hereof to a surface by any conventional application method (including spincoating). For example, when used as a middle layer, the compositions would typically be applied to the top of a cured bottom anti-reflective coating, with the cured bottom anti-reflective coating being on a substrate. Exemplary substrates include Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal substrates.

Cured compositions or middle layers according to the invention exhibit particularly good properties at wavelengths of less than about 400 nm (e.g., at 157-, 193-, and 248-nm wavelengths). For example, the cured compositions have an etch selectivity to resist (i.e., the middle layer etch rate divided by the photoresist etch rate) of at least about 1:1, and preferably at least about 1.2:1, when $CF_4$ is used as the etchant and 193-nm photoresists are used. The cured compositions have an etch selectivity to bottom anti-reflective coating of less than about 1:4, and preferably from about 1:11-1:31 when $O_2$ is used as the etchant and aromatic-containing bottom anti-reflective coatings are used.

Additionally, at 193- and 248-nm wavelengths, the cured layers have a k value (i.e., the imaginary component of the complex index of refraction) of less than about 0.5, and preferably less than about 0.08, and an n value (i.e., the real component of the complex index of refraction) of from about 1.4-1.8.

Furthermore, the cured layers according to the invention will be substantially insoluble in typical photoresist solvents. Thus, when subjected to a stripping test as defined herein, the cured layers will have a percent stripping of less than about 5%, preferably less than about 1%, and even more preferably about 0%. The stripping test involves first determining the thickness (by taking the average of measurements at five different locations) of a cured film. This is the average initial film thickness. Next, a solvent (e.g., ethyl lactate) is puddled onto the cured film for about 5 seconds, followed by spin drying at about 5,000 rpm for about 30 seconds to remove the solvent. The film thickness is measured again at five different points on the wafer using ellipsometry, and the average of these measuremnents is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

When the inventive compositions are subjected to a spin bowl compatibility test, they will achieve a result of at least about 90%, and preferably at least about 95% will be achieved. As used herein, the spin bowl compatibility is determined by coating a wafer with the composition. After coating, the wafers are not baked, but are instead placed in a wafer cassette. The coated surfaces are positioned upward in order to prevent film flow, and the samples are allowed to dry for about 24 hours in a cleanroom (ambient conditions) to yield films around 1300 Å thick. The sample thickness is measured on each wafer and is designated as the initial sample thickness.

The coated wafer is then exposed to a test solvent such as ethyl lactate or PGMEA. This is accomplished by centering a sample wafer on a spinner, followed by coating with the solvent evenly over the entire surface of the wafer. The sample is allowed to soak for 3 minutes followed by spinning dry for about 1 second at about 1500 rpm. After spinning, the thickness of the sample on the wafer is measured and designated as the final thickness.

The percent solubility is then calculated as follows:

$$\% \text{ solubility} = \left[\frac{(\text{initial sample thickness} - \text{final sample thickness})}{(\text{initial sample thickness})}\right] * 100.$$

A photoresist can be applied to the cured material, followed by drying (soft bake), exposing, post-exposure baking, and developing the photoresist. Following the methods of the invention will yield precursor structures for use in trilayer processes, with the photoresist and middle layer in the "stacks" being relatively thin compared to prior art stacks. The cured bottom anti-reflective coating will typically have a thicknesses of from about 2,000-8,000 Å to ensure adequate etch resistance when transferring the photoresist patterns to the substrate. The cured inventive middle layers will have a thickness of less than about 2,150 Å, preferably less than about 1,000 Å, and more preferably from about 300-600 Å. The dried photoresists will have a thickness of less than about 200 nm, preferably less than about 150 nm, and more preferably from about 60-150 nm. It will be appreciated that this is a significant advantage over prior art in that the imaging properties of the photoresist are present, and the bottom anti-reflective coating is protected even with a small stack size.

DETAILED DESCRIPTION OF THE PREFERRED EMBODIMENTS

EXAMPLES

Figure 1:
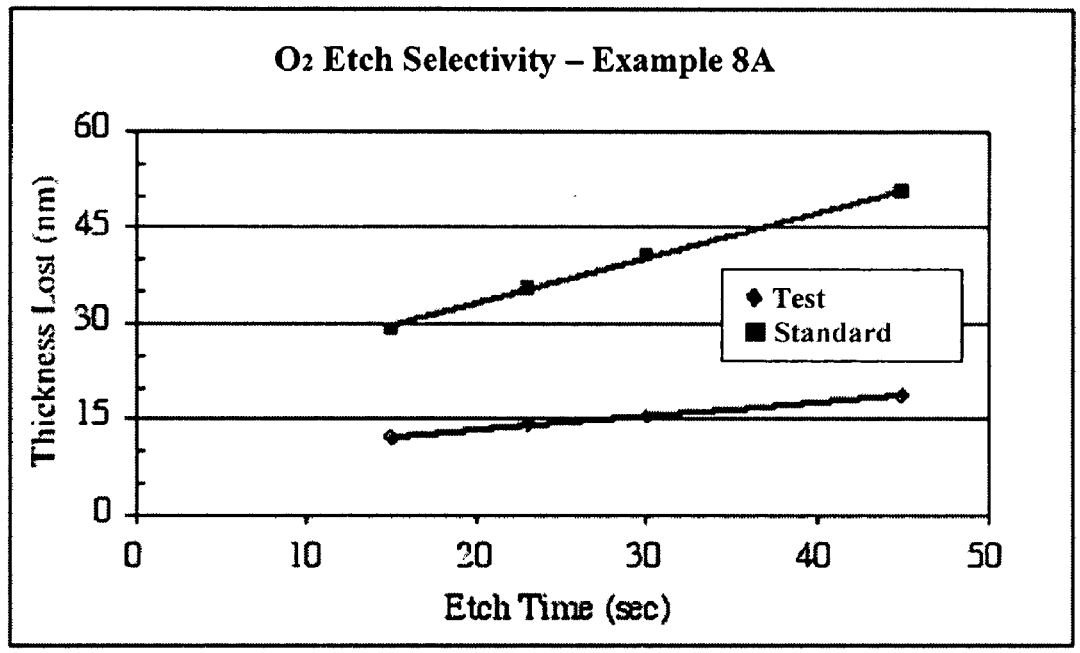
FIG. 1 is a graph depicting the improved etch resistance of one of the inventive compositions when $O_2$ is used as the etchant.

The following examples set forth preferred methods in accordance with the invention. It is to be understood, however, that these examples are provided by way of illustration and nothing therein should be taken as a limitation upon the overall scope of the invention.

Example 1

Organo-Silicon Middle Layer

1. Mother Liquor Synthesis

A 500-ml, three-necked flask equipped with magnetic stirring bar, thermometer, nitrogen inlet, and condenser with nitrogen outlet was charged with 21.5 g (125 mmol) of trimethylsilylmethyl methacrylate, 15.2 g (105 mmol) of hydroxypropyl methacrylate, 148.0 g of PGMEA, and 367.0 mg of 2,2'-azobisisobutyronitrile (AIBN). The mixture was flushed with nitrogen for 15 minutes at ambient conditions, and the reaction flask then immersed into a heated oil bath. The polymerization solution was stirred under nitrogen at 72-74° C. solution temperature for 24 hours. After cooling to <35° C., about 46.2 mg of 4-methoxyphenol was added as an inhibitor, and the reaction product was stirred to homogeneity. The yield of copolymer solution was 98.2% of the theoretical yield. The weight-average molecular weight (Mw) for the copolymer by gel permeation chromatography (GPC) was 62,137.

2. Formulation of Middle Layer

In this procedure, 38.5 g (21.9 meq polymeric hydroxyl) of the mother liquor prepared in Part 1 of this example, 249.0 g of PGMEA, 31.1 g of PnP, 2.35 g (21.9 meq) of POWDERLINK 1174 (an aminoplast crosslinking agent available from Cytec Industries), 97.6 mg of p-toluenesulfonic acid monohydrate (TSA), and 293.8 mg of bisphenol S were stirred to homogeneity at ambient conditions. About 16.1 g of PGME-washed 650C beads were added, and the mixture was tumbled for 4 hours at ambient conditions to effect deionization. The beads were removed by straining through two layers of plastic cloth, and the coating filtered twice through a 0.1 µm end-point filter.

3. Film Properties

The coating prepared in Part 2 of this example was spin-coated onto a silicon wafer at 1500 rpm for 60 seconds and cured at 205° C. for 60 seconds using a hotplate under vacuum. The resulting middle layer film had a thickness of 79.5 nm. No smoking occurred during the hot plate bake, and the coating quality was very good. In an ethyl lactate thickness, stripping test to establish insolubility of the thermoset film in solvent, ethyl lactate was puddled on the film for 5 seconds and then spun off at 5000 rpm for 30 seconds. Film thickness was then re-measured. Stripping of ≦15 Å is considered acceptable. In the stripping test for this product, the film thickness increased by 3.51 Å (+0.32%). The film's 193-nm OD was 1.44/µm.

4. Lithography

A trilayer stack comprised of a 330-nm thick layer of 193-nm photoresist (AR237J, available from JSR) on top of an 80-nm thick middle layer (as prepared in Part 2 of this example), on top of a 451-nm thick film of a bottom anti-reflective coating (see Part 2 of Example 2) gave excellent 0.11 µm semi-dense L/S with 0.4 µm depth-of-focus (DOF). Also, a trilayer stack including a 330-nm thick layer of AR237J on an 80-nm thick middle layer (prepared according to Part 2 of this example) on top of a 77-nm thick single layer anti-reflective coating (ARC29A-8, available from Brewer Science Inc., Rolla, Mo.) gave excellent 0.11 µm semi-dense L/S.

Example 2

Novolac Resin with Pendant Adamantane Function

1. Preparation of Mother Liquor from Epoxy Novolac

A 500-ml, three-necked flask equipped with magnetic stirring bar, thermometer, nitrogen inlet, and condenser with nitrogen outlet was charged with 25.0 g (142 meq epoxy) of an epoxy novolac (D.E.N. 431, available from Dow Chemical), 196.6 g of PnP, 24.36 g (135.2 mmol) of 1-adamantanecarboxylic acid, and 770 mg (3.38 mmol) of benzyltriethylammonium chloride. The mixture was flushed with nitrogen for 10 minutes at ambient conditions, and the reaction flask was then immersed in a heated oil bath. The reaction solution was stirred under nitrogen for 24.5 hours at 117.5-120° C. The yield of product was 244.8 g (99.2% of the theoretical yield).

2. Formulation of Bottom Anti-Reflective Coating

About 120.0 g (65.7 meq polymeric hydroxyl function) of the mother liquor from Part 1 of this example, 31.6 g of PnP, 54.7 g of PGMEA, 7.42 g (69.0 meq) of POWDERLINK 1174, and 742.6 mg of TSA were stirred at ambient conditions to homogeneity. About 5 weight % (10.7 g) of PGME-washed 650C deionization beads were added, and the mixture was tumbled for 4 hours at ambient conditions to effect deionization. The beads were removed by straining through two layers of plastic cloth, and the bottom anti-reflective coating was then filtered twice through 0.1-µm end-point filters.

3. Film Properties

The coating was spin-coated directly onto a silicon wafer at 1500 rpm for 60 seconds and cured at 205° C. for 60 seconds using a hot plate under vacuum. The resulting film had a thickness of 439.7 nm. Slight smoking occurred during the hot plate bake. The coating quality was good when assessed visually and under the microscope. Ethyl lactate thickness stripping was measured as only 5.3 Å (−0.12%). The cured bottom anti-reflective coating had a 193-nm optical density of about 10.5/µm.

4. Optical Properties

The optical properties for the bottom anti-reflective coating prepared in Part 2 of this example were measured at 193-nm using a variable-angle spectroscopic ellipsometer (VASE) instrument. The n-value (real part of refractive index) was 1.6212, and the k-value (imaginary part of refractive index) was 0.3596.

5. Prolith Modeling Reflectivity Back into the Resist

A trilayer stack using a 390-nm thick layer of photoresist (PAR-710, available from Sumitomo) on a 60.0-nm thick middle layer (prepared as described in Part 2, Example 5) on different thicknesses of the bottom anti-reflective coating prepared in Part 2 of this example was modeled on a silicon substrate using Prolith. The simulation results showed a straight line of slightly <0.8% reflectance back into the photoresist at all bottom anti-reflective coating thicknesses between 300 and 700 nm.

6. Percent Planarity Over 200-nm Topography

At a coating thickness of approximately 451 nm, the bottom anti-reflective coating gave 74 to 90% planarity (1:1, 1:2, 1:4 L/S patterns) over 200-nm topography.

7. Lithography

This testing was carried out as described in Part 4 of Example 1. A trilayer stack comprised of a 330-nm thick layer of 193-nm photoresist (AR237J), on top of an 80-nm thick middle layer (prepared as described in Part 2 of Example 1), on top of a 451-nm thick layer of a bottom anti-reflective coating (prepared in Part 2 of this example) was imaged and wet developed. SEM photos of cross-sections showed 0.11-μm semi-dense line spacing with 0.4-μm DOF. The lines were very rectangular in shape.

Example 3

Organo-Silicon Middle Layer

1. Mother Liquor Synthesis

A 250-ml, three-necked flask equipped with magnetic stirring bar, thermometer, nitrogen inlet, and condenser with nitrogen outlet was charged with 12.5 g (72.5 mmol) of trimethylsilylmethyl methacrylate, 5.65 g (39.2 mmol) of hydroxypropyl methacrylate, 103.6 g of PGMEA, and 0.183 g of AIBN. The mixture was purged with nitrogen at ambient conditions for 15 minutes and then stirred under nitrogen at 80-87° C. (primarily 84-86° C.) for 24 hours. After cooling to less than 40° C., 36.6 mg of 4-methoxyphenol inhibitor was added, and the solution was stirred to homogeneity. The yield of product was 92.8% of the theoretical yield. The Mw for the copolymer via GPC was 33,401.

2. Formulation of Middle Layer

About 60.0 g (19.3 meq polymeric hydroxyl) of the mother liquor prepared in Part 1 of this example, 212.2 g of PGMEA, 2.28 g (21.2 meq) of POWDERLINK 1174, 93.9 mg of TSA, and 285.2 mg of bisphenol S were stirred to homogeneity at ambient conditions. Deionization was effected by adding 13.7 g of PGME-washed 650C deionization beads and tumbling at ambient conditions for 4 hours. The beads were subsequently removed by straining through two layers of plastic cloth, and the solution was filtered twice through a 0.1-μm end-point filter.

3. Film Properties

The coating was spin-coated onto a silicon wafer at 1500 rpm for 60 seconds and cured at 205° C. for 60 seconds using a hot plate under vacuum. The resulting film had a thickness of 107.8 nm. No smoking occurred during the hot plate bake, and coating quality was good. In the ethyl lactate stripping test, the film swelled by +0.40%. The film's 193-nm OD was 1.23/μm.

4. Optical Parameters

The optical constants for the coating were measured at 193 nm using a VASE instrument. The n-value was 1.694, and the k-value was 0.0403.

5. Etch Selectivity

The $O_2$ etch selectivity of the middle layer to a multilayer bottom anti-reflective coating (DH2333-1-1, a bottom anti-reflective coating using an acrylic/9-anthracenecarboxylic acid adduct binder polymer) on a Trion etcher was 1 to 6.4. On an NSC (ES401) etcher, the $CF_4$ etch selectivity of the middle layer to a 193-nm photoresist (PAR-710, available from Sumitomo) was 1.44. Using an Applied Materials etcher, the $CF_4$ etch selectivity was measured as 1.24.

6. Lithography

A trilayer stack comprised of a 330-nm thick layer of 193-nm photoresist (AR237J) on top of a 108-nm thick middle layer prepared according to Part 2 of this example which was on top of a 77-nm thick, single layer bottom anti-reflective coating (ARC29A, available from Brewer Science Inc.) gave excellent 0.11-μm semi-dense line spacing with 0.3-μm DOF after wet development.

Example 4

Novolac Resin with Pendent Adamantane Function

1. Mother Liquor Synthesis

A 500-ml three-necked flask equipped with a magnetic stirring bar, thermometer, nitrogen inlet, and condenser with nitrogen outlet was charged with 25.0 g (140 meq epoxy) of D.E.N. 438, 276.8 g of PGME, 23.98 g (133.0 mmol) of 1-adamantanecarboxylic acid, and 0.759 g (3.33 mmol) of benzyltriethylammonium chloride. The mixture was gently flushed with nitrogen for 10 minutes at ambient conditions and then immersed in a heated oil bath. The reaction solution was heated under nitrogen at 115° C. for 24 hours.

2. Formulation of Bottom Anti-Reflective Coating

About 125.0 g (50.9 meq of polymeric hydroxyl) of the mother liquor prepared in Part 1 of this example, 45.6 g of PGMEA, and 4.38 g (40.8 meq) of POWDERLINK 1174 were stirred to homogeneity at ambient conditions. The resulting solution was deionized by tumbling with 8.75 g of PGME-washed 650C beads for 4 hours. The beads were removed by straining through two layers of plastic cloth. The deionized solution was then filtered twice through a 0.20/0.45-μm end-point filter into a tared Nalgene bottle. About 758 mg of pyridinium tosylate were added per 175.0 g of filtrate. The product (now containing catalyst) was stirred to homogeneity and twice filtered through a 0.1-μm end-point filter.

3. Film Properties

The bottom anti-reflective coating prepared in Part 2 of this example was spin-coated onto a silicon wafer at 1500 rpm for 60 seconds, followed by a cure at 205° C. for 60 seconds under a hot plate vacuum gave a thickness of 476-nm. The coating quality was good visually, but mottled (uneven) under the microscope. In the ethyl lactate stripping test, the film thickness decreased by 0.35%. The cured film's 193-nm OD was about 10.1-11.4/μm.

4. Optical Parameters

As measured at 193 nm using a VASE, the n-value for the bottom anti-reflective coating prepared in Part 2 of this example was 1.62, and the k-value was 0.34.

5. Etch Selectivity

Using an Applied Materials etcher, the etch selectivity of this bottom anti-reflective coating to Sumitomo's PAR-710 resist was 0.946 with an $O_2$- plasma, and 0.954 with a $CF_4$- plasma.

6. Percent Planarity Over 200-nm Topography

At a coating thickness of about 475-nm, the coating gave 84-94% planarity (1:1, 1:2, 1:4 L/S) over 200-nm topography.

7. Spin Bowl Compatibility

A rapid re-dissolution of a dried bottom anti-reflective coating in coating solvents is considered essential to prevent build-up of polymer on the walls of the spin bowl and to avoid the need for an unwanted bowl cleaning step. If at least about 90% of the dried coating re-dissolves during the test, the product is considered spin bowl compatible. This coating exhibited completely satisfactory spin bowl compatibilities that varied between 97.6-99.5% for six different solvents (acetone, cyclohexanone, 2-heptanone, ethyl lactate, PGME, and PGMEA).

8. Resist Interlayer

Any intermixing of photoresist with cured anti-reflective coating during application of the photoresist may result in footing or slope at the base of resist features. To quantitatively measure intermixing, a photoresist interlayer test is run by: (1) applying and curing the coating on a silicon substrate; (2) measuring the coating thickness; (3) applying a resist onto the coating; (4) drying, exposing, and post-exposure baking the resist; (5) developing the resist; (6) water rinsing the wafer followed by drying; (7) re-measuring the coating thickness; and (8) calculating the change in coating thickness. Using Sumitomo's AX4846A-25 as the resist gave 48 Å for the interlayer for the coating in Part 2 of this example. An interlayer value of less than about 50 Å is considered acceptable.

9. Lithography

This product was not tested in a trilayer imaging configuration. However, using this coating as a thick (477-nm) bottom anti-reflective coating under JSR's 193-nm resist AR237J (model bilayer configuration) gave standing 0.12-μm, semi-dense L/S. The DOF was extremely narrow (ca. 0.2 μm), and an interaction layer between the resist and coating was clearly visible.

Example 5

Organo-Silicon Middle Layer

1. Mother Liquor Synthesis

A 500-ml three-necked flask equipped with a magnetic stirring bar, thermometer, nitrogen inlet, and condenser with nitrogen outlet was charged with 18.04 g (104.7 mmol) of trimethylsilylmethyl methacrylate (Gelest, product number SIM6485.6), 8.15 g (56.4 mmol) of hydroxypropyl methacrylate (Aldrich, product number 26,854-2), 149.5 g of PGMEA, and 261.9 mg of AIBN. The polymerization mixture was purged with nitrogen for 16 minutes at ambient conditions, and the reaction flask then immersed in a heated oil bath. The reaction was stirred under nitrogen atmosphere for 24 hours at a solution temperature of 69-74.5° C. After the solution was cooled to 34° C., 44.4 mg of 4-methoxyphenol was added as an inhibitor. This solution was then stirred to homogeneity. The weight of the product was 98% of the theoretical yield. The weight-average molecular weight (Mw) for this copolymer was 74,073.

2. Formulation of Middle Layer

The following ingredients were added to a 1-liter Nalgene bottle in the stated order: 60.0 g (19.2 meq polymeric hydroxyl) of the mother liquor prepared in Part 1 of this example, 287.3 g of PGMEA, 2.28 g (21.2 meq) of POWDERLINK 1174, 93.9 mg of TSA, and 285.2 mg of bisphenol S. The mixture was stirred to homogeneity at ambient conditions, followed by a 4-hour tumble with 5 weight % of PGME-washed 650C deionization beads. The beads were removed by straining through two layers of plastic cloth. The coating was then filtered twice through a 0.1-μm end-point filter.

3. Film Properties

The composition prepared in Part 2 of this example was spin-coated directly onto a silicon wafer at 1500 rpm for 60 seconds and cured at 205° C. for 60 seconds on a hot plate under vacuum. The result was 86.4 nm of cured film. Smoke was not observed during the hot plate bake step, and coating quality was good. In the ethyl lactate stripping test, the film increased (swelled) in thickness by +0.52% (4 to 5 Å). The 193-nm optical density (OD) of the silicon-containing film was only 1.10/μm.

4. Optical Parameters

As measured at 193 nm by a VASE, the n-value for this coating was 1.691, and the k-value was 0.0396.

5. Etch Selectivity

The etch selectivity of this coating to PAR-710 using an NSC etcher (model ES401) and a $CF_4$-plasma was 1.50.

Example 6

Novolac Resin with Pendent Adamantane Function

1. Preparation of Mother Liquor

A 500-ml three-necked flask equipped with magnetic stirring bar, thermometer, nitrogen inlet, and condenser with nitrogen outlet was charged with 25.0 g (140 meq epoxy) of D.E.N. 438, 196.2 g of PGMEA, 24.0 g (133 mmol) of 1-adamantanecarboxylic acid, and 758.8 mg (3.33 mmol) of benzyltriethylammonium chloride. The mixture was gently purged with nitrogen for 15 minutes at ambient conditions and then immersed in an oil, bath. The reaction solution was heated under nitrogen at 113-119° C. (primarily 113° C.) for 24 hours. The yield of product was 98.3% of the theoretical yield.

2. Formulation of Bottom Anti-Reflective Coating

About 120.0 g (64.9 meq polymeric hydroxyl) of mother liquor prepared in Part 1 of this example, 85.9 g of PGMEA, 7.36 g (68.5 mmol) of POWDERLINK 1174, and 736.3 mg of TSA were stirred at ambient conditions to give a solution. Deionization was effected by adding 10.7 g of PGME-washed 650C beads and tumbling for 4 hours. The beads were removed by straining through two layers of plastic cloth and the solution then filtered through a 0.1-μm end-point filter.

3. Film Properties

The coating prepared in Part 2 of this example was spin-coated onto a silicon wafer at 1500 rpm for 60 seconds and cured at 205° C. for 60 seconds under hotplate vacuum. The film thickness was 4142 Å. The coating quality was good, but considerable smoke evolved during the hot plate bake. In the ethyl lactate stripping test, 4.5 Å (−0.11%) of cured film was lost. The film's OD at 193 nm was 9.21/μm.

4. Interlayer Test

This test was described under Part 8 of Example 4. The measured interlayer for this coating using Sumitomo's AR4846A25 as the resist was 134 Å.

5. Lithography

A trilayer configuration of JSR's AR237J on top of a middle layer as prepared in Part 2 of Example 5, on top of a coating as prepared in Part 2 of this example was imaged and yielded 100-nm, semi-dense L/S with a 0.5 μm DOF.

Example 7

1. Mother Liquor Synthesis

A 250-ml, three-necked flask equipped with a magnetic stirring bar, thermometer, nitrogen inlet, and condenser with nitrogen outlet was charged with 5.0 g (39.5 mmol) of methacryloxymethylphenyldimethylsilane [Gelest, SIM6481.5], 1.65 g (11.4 mmol) of hydroxypropyl methacrylate, 60.3 g of PGMEA, and 66.3 mg of AIBN. The mixture was flushed with nitrogen for 15 minutes at ambient conditions, and the flask then immersed in an oil bath. Stirring under a nitrogen atmosphere, the polymerization solution temperature was maintained at 70-71° C. for 23 hours. After cooling to <35° C., about 11.9 mg of 4-methoxyphenol was added as inhibitor, followed by stirring to homogeneity overnight. The weight of product was 98% of the theoretical yield.

2. Formulation of the Middle Layer

About 60.4 g of the mother liquor prepared in Part 1 of this example, 77.1 g of PnP, and 0.77 g of POWDERLINK 1174 were stirred at ambient conditions to homogeneity. About 6.9 g of deionization beads were added, and the mixture was tumbled for 4 hours at ambient conditions. The beads were removed by straining through 2 layers of plastic cloth, and the coating filtered twice through a 0.1 µm end-point filter. Pyridinium tosylate (0.097 weight % of filtrate) was added, and the mixture was stirred to homogeneity and filtered once through a 0.1 µm end-point filter.

3. Film Properties

The middle layer composition prepared in Part 2 of this example was spin-coated directly onto a silicon wafer at 1500 rpm for 60 seconds and cured at 205° C. for 60 seconds with a hotplate vacuum to yield a cured film having a thickness of 1315 Å. Very slight smoking on the hotplate was observed during curing. The film had a good coat quality. The ethyl lactate film thickness stripping was −0.08%, and 193-nm OD of the layer was 13.2/µm.

4. Lithography

This middle layer composition was spun/cured directly onto a silicon wafer to yield a film having a thickness of 136.4 nm. A photoresist (AR237J) was coated/dried to a thickness of 330 nm on the middle layer. After exposure/processing, SEM photos showed 0.11-µm, semi-dense L/S with some footing at the base of lines and a thin resist interaction layer.

Example 8A

1. Mother Liquor Synthesis from MethacrylEthyl Polyhedral Oligomeric Silsesquioxane A 100-ml three-necked flask equipped with magnetic stirring bar, thermometer, nitrogen inlet, and condenser with nitrogen outlet was charged with 4.00 g (5.35 mmol) of methacrylethyl polyhedral oligomeric silsesquioxane, 2.67 g (18.52 mmol) of hydroxypropyl methacrylate), 60.7 g of PGMEA, and 66.6 mg of AIBN. The mixture was polymerized under a nitrogen blanket for 24 hours at 60.5-63° C. After the solution cooled to 26.5° C., 17.1 mg of 4-methoxyphenol was added as an inhibitor. Stirring to homogeneity, the weight of product was 98.7% of the theoretical yield. The weight-average molecular weight of this copolymer as determined by GPC was 55,700.

2. Formulation of the Corresponding Middle Layer

The following ingredients were added to a 250 ml Nalgene bottle in the stated order: 30.0 g of the mother liquor prepared in Part 1 of this example, 89.8 g of PGMEA, 886 mg of POWDERLINK 1174, 36.8 mg TSA, and 110.6 mg of 4,4'-sulfonyldiphenol. The mixture was stirred to homogeneity at ambient conditions, followed by a 4-hour tumble with 6.0 g of PGME-washed 650C deionization beads. The beads were removed by straining through two layers of plastic cloth, and the middle layer was then filtered twice through a 0.1 µm end-point filter.

3. Film Properties

The middle layer was spun directly onto silicon wafers at 1250 rpm for 60 seconds followed by curing at 205° C. for 60 seconds with hotplate vacuum to yield a film having a thickness of 736.1 Å. A trace of smoking was visible during the hotplate bake. The ethyl lactate thickness stripping was +0.43% (i.e., a slight swell). Spinning/curing onto quartz wafers using identical conditions gave a 193-nm OD of 1.6.

4. Optical Parameters

A VASE was used to measure the real part of the refractive index (n) and the imaginary part of the refractive index (k) for the cured film. The 193-nm n and k values were 1.66 and 0.059, respectively.

5. Plasma Etching the Cured Film on a Silicon Substrate

Figure 2:
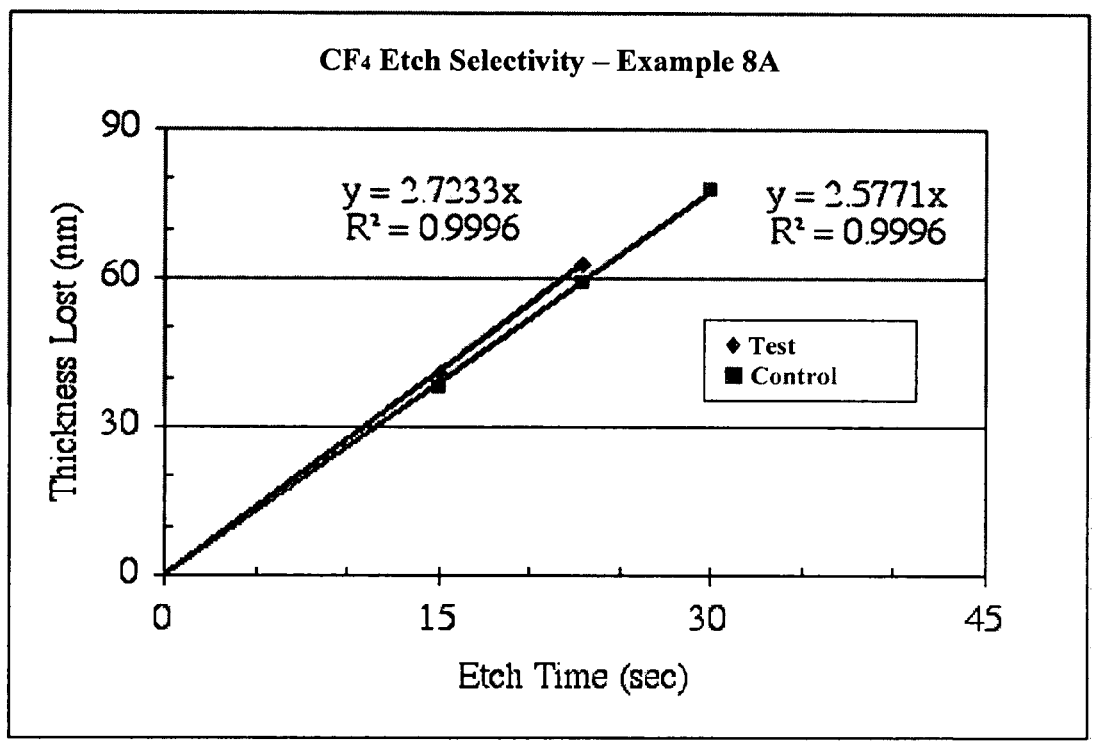
FIG. 2 is a graph depicting the etch selectivity of one of the inventive compositions when $CF_4$ is used as the etchant.

Using a Trion etcher, the middle layer of Part 2 of this example and the a control or standard middle layer (EML DH2333-29, a middle layer having alkyl silane) were etched with: a) $O_2$ and b) $CF_4$. The results are shown in FIGS. 1 and 2, with the layer of-Part 2 of this example etching much slower than the alkyl silane standard in $O_2$, but at a selectivity of about 1.1 in $CF_4$.

6. Trilayer Lithography

Figure 3:
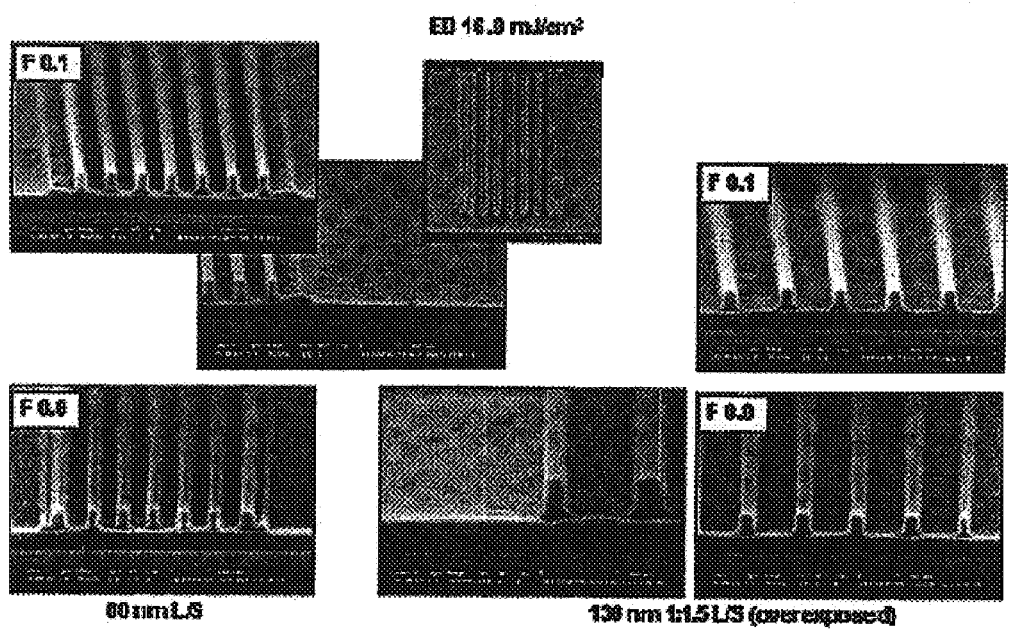
FIG. 3 shows several scanning electron microscope (SEM) photographs containing respective cross-sectional views of wafers that have been processed with the inventive middle layers.

A trilayer configuration was formed of ARC29A-8 (thickness of 77 nm, available from Brewer Science Inc.) topped with a 73.6-nm thick layer of the middle layer formed in Part 2 of this example with a thin layer (200 nm) of the resist, GARS8107A10 (available from Arch Chemical). Exposure and wet processing yielded 80-nm dense, 1:1, L/S, with some line footing and a small amount of scum between the lines. The SEM data is shown in FIG. 3.

Figure 4:
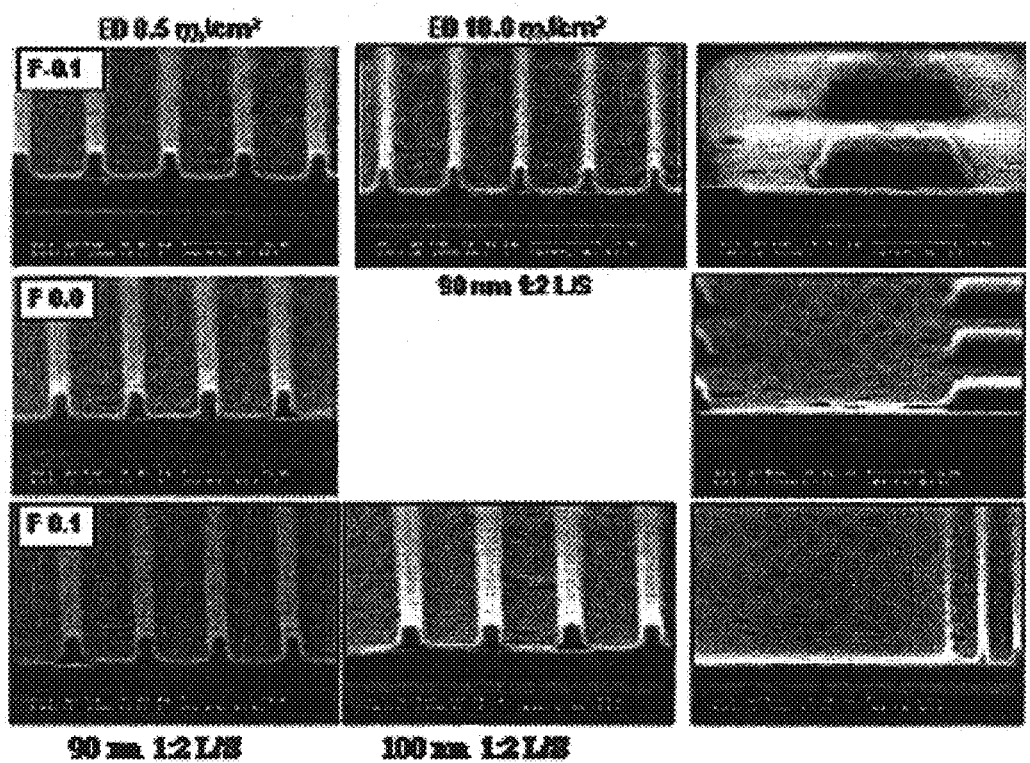
FIG. 4 shows several SEM photographs containing respective cross-sectional views of wafers that have been processed with the inventive middle layers.

A trilayer stack comprised of a thin layer of the resist, GARS8207K21 (thickness of 150 nm, available from Arch Chemical), on top of a 73.6-nm thick layer of the middle layer from Part 2 of this example, on top of a thin layer (77 nm) of ARC29A-8 was exposed and wet-processed to yield 90-nm, 1:2 L/S. The SEM data is shown in FIG. 4.

7. Spin Bowl Compatibility

The middle layer of Part 2 of this example was tested for re-dissolving or spin bowl performance using the procedure described previously. About 52-82% of the dried films re-dissolved. The solvents were acetone, cyclohexanone, 2-heptanone, ethyl lactate, PGME, and PGMEA. This was below the specified passing value of $\geq$90% re-dissolution.

Example 8B

1. Formulation of Middle Layer

The following ingredients were stirred at ambient conditions to give a solution: the mother liquor prepared in Part 1 of Example 8A (28.0 g), PGMEA (43.5 g), PGME (11.2 g), POWDERLINK 1174 (413.3 mg), bisphenol A (104.2 mg), TSA (6.0 mg), and CYMEL 303LF (17.3 mg). About 4.2 g of PGME-washed 650C beads were added, the mixture tumbled for 4 hr to effect deionization, and the beads then removed by straining through two layers of plastic cloth. The middle layer composition was then filtered through a 0.1 µm end-point filter.

2. Film Properties

The middle layer composition prepared in Part 1 of this example was spin-coated onto silicon wafers at 1500 rpm for 60 seconds followed by a cure at 205° C. for 60 seconds with hotplate vacuum to yield a film thickness of 884.6 Å. A spin/cure process onto quartz wafers using identical conditions gave a 193-nm optical density of 0.95. Coat quality was good both visually and under the microscope. The ethyl lactate stripping test resulted in a +0.85% increase in film thickness, i.e., film swelling rather than film loss.

3. Optical Parameters

Using the VASE, the n and k values of the cured film were 1.646 and 0.025, respectively, at 193 nm.

4. Spin Bowl Compatibility

The re-dissolution performance of this layer was measured using the spin bowl compatibility test described previously. The following solvents were used in this test: acetone, cyclohexanone, 2-heptanone, ethyl lactate, PGME, and PGMEA. About 96.1-97.5% of the film re-dissolved, showing the product to be highly spin bowl compatible, thus differing from the film prepared in Example 8A.

Example 9

1. Mother Liquor Synthesis Using MethacrylIsobutyl Polyhedral Oligomeric Silsesquioxane A 250-ml, three-necked flask equipped with a magnetic stirring bar, thermometer, nitrogen inlet, and condenser with nitrogen outlet was charged with 2.67 g (18.5 mmol) of hydroxypropyl methacrylate, 70.28 g of PGMEA, 5.05 g (5.35 mmol) of methacrylisobutyl polyhedral oligomeric silsesquioxane, and 77.3 mg of AIBN. The mixture was flushed with nitrogen for 15 minutes at ambient conditions, and the flask was immersed in an oil bath at 66° C. The reaction solution was stirred under a nitrogen blanket for 24 hours at 64-65.5° C. With the reaction solution temperature <26° C., about 19.6 mg of 4-methoxyphenol was then added as an inhibitor. The mixture was stirred to homogeneity at ambient conditions, with the yield being 75.3 g (96.4% recovery). The Mw for the copolymer via GPC analysis was 56,500. In addition to the copolymer, there was a minor peak in the GPC scan with a Mw of 764 that may have corresponded to unreacted methacrylisobutyl polyhedral oligomeric silsesquioxane.

2. Formulation of Middle Layer

The following ingredients were stirred at ambient conditions to form a middle layer composition: the mother liquor prepared in Part 1 of this example (32.0 g), PGMEA (48.1 g), PGME (12.5 g), POWDERLINK 1174 (408.1 mg), bisphenol A (102.6 mg), TSA (6.0 mg), and CYMEL 303LF (17.2 mg). The solution was deionized by tumbling with 5 weight % of PGME-washed 650C beads for 4 hr. The beads were removed by straining through two layers of plastic cloth, and the middle layer was then filtered twice through a single 0.1 μm end-point.

3. Film Properties

The middle layer prepared in Part 2 of this example was spin applied to silicon wafers at 1000 rpm for 60 seconds and cured at 205° C. for 60 seconds with hotplate vacuum. The film thickness was 1148.11 Å. A moderate amount of smoke evolved during the hotplate bake step. Coat quality was excellent, both visually and under the microscope. Ethyl lactate stripping resulted in +0.28% change in the cured film thickness.

Using identical spin/cure conditions, the hardmask was then applied to quartz wafers. The 193-nm absorbance was very low (+0.075), with the OD then being only 0.65.

4. Spin Bowl Compatibility

This CYMEL 303LF-containing middle layer composition was 94% (composite score) spin bowl compatible using the following different solvents: acetone, cyclohexanone, 2-heptanone, PGME, ethyl lactate, and PGMEA.

Example 10A

1. Formulation of Middle Layer from Octahydroxypropyldimethylsilyl Polyhedral Oligomeric Silsesquioxane A 125-ml Nalgene bottle was charged with 1.526 g (8.24 mmol hydroxyl function) of octahydroxypropyldimethylsilyl polyhedral oligomeric silsesquioxane, 67.3 g of PGMEA, 660.5 mg (6.14 meq) of POWDERLINK 1174, 27.4 mg TSA, and 82.3 mg of 4,4'-sulfonyldiphenol. The mixture was stirred at ambient conditions giving a solution. About 3.5 g of PGME-washed 650C beads were added, and the mixture was tumbled for 4 hours at ambient conditions to remove cations. The beads were removed by straining through two layers of plastic cloth. The middle layer composition was then filtered twice through a 0.1-μm end-point filter.

2. Film Properties

Spin application onto silicon wafers was at 1000 rpm for 60 seconds, with curing being carried out at 205° C. for 60 seconds with hotplate vacuum. The film thickness was 657.7 Å. There was no smoking during the hotplate bake. Coat quality, both visually and under the microscope, was good. Ethyl lactate stripping was +0.09%. Application/cure on quartz wafers using identical conditions gave a 193-nm absorbance of 0.129 and a 193-nm OD of 1.96.

3. Optical Parameters

The VASE was used to measure the 193-nm n and k values for cured film, with the respective numbers being 1.677 and 0.0669.

4. Spin Bowl Compatibility

This property was checked using seven different solvents: acetone, cyclohexanone, 2-heptanone, PGME, ethyl lactate, PGMEA, and 1-methyl-2-pyrrolidinone. The percent re-dissolution varied between 9.7% and 11.0%. The middle layer composition was not spin bowl compatible.

5. Plasma Etching the Cured Film on a Silicon Substrate

Figure 5:
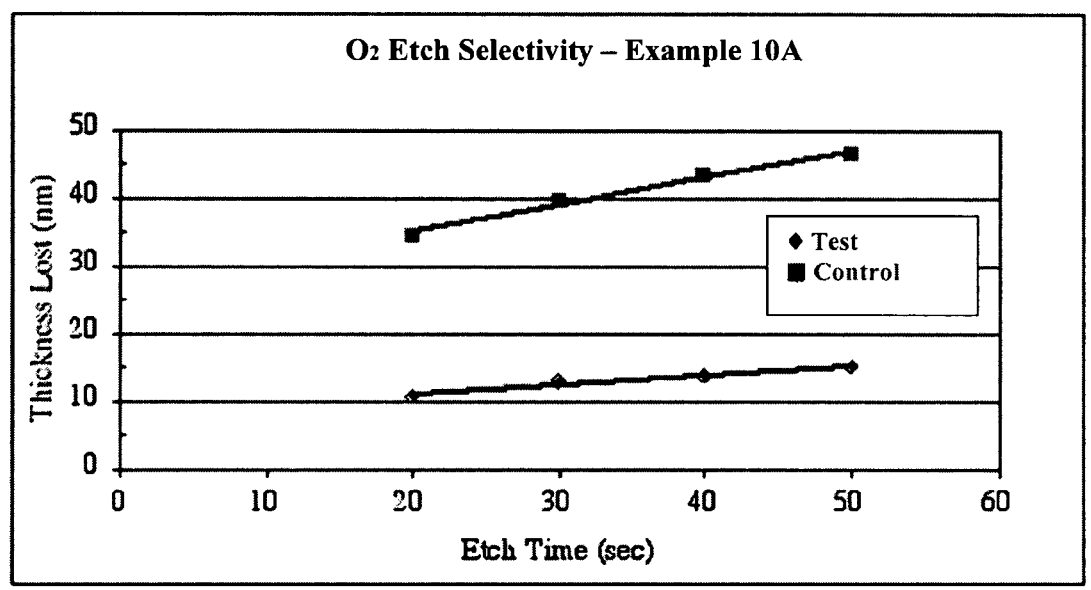
FIG. 5 is a graph depicting the improved etch resistance of one of the inventive compositions when $O_2$ is used as the etchant.
Figure 6:
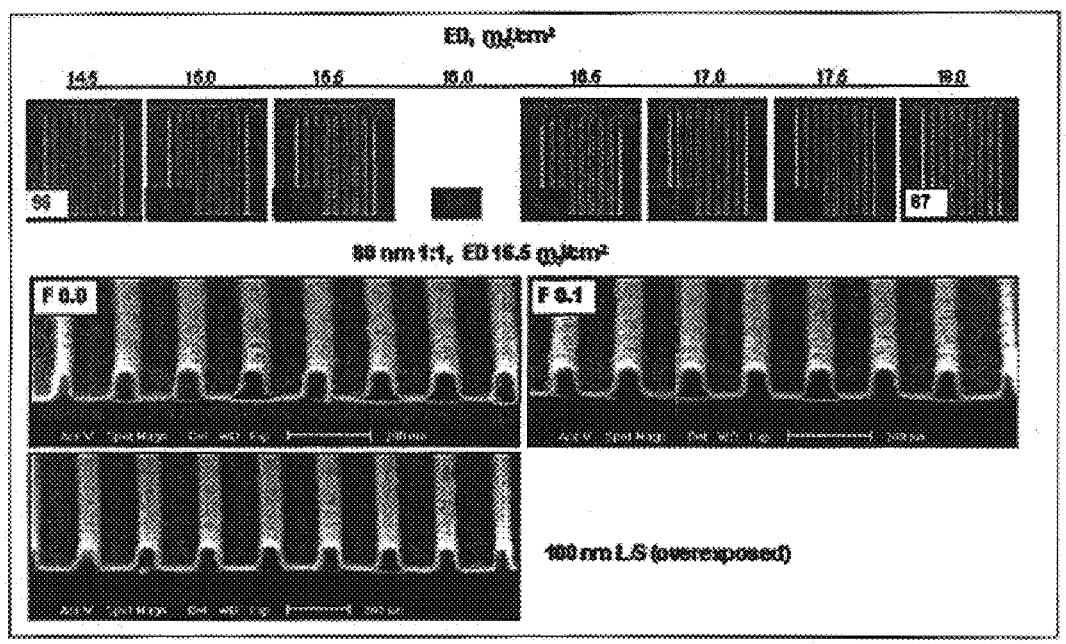
FIG. 6 shows several SEM photographs containing respective cross-sectional views of wafers that have been processed with the inventive middle layers.

Using a Trion etcher with $O_2$ as the etching gas, the middle layer prepared in Part 2 of this example etched about 68.6% slower than the alkyl silane standard (hard mask DH2333-29), i.e., the etch selectivity for the former relative to the latter was 0.30-0.32. The data is shown in FIG. 5.

6. Trilayer Lithography

A trilayer stack comprised of a thin layer (200 nm) of resist (GARS8107A10) on top of a 658-Å layer of the middle layer prepared in Part 1 of this example, on top of a bottom anti-reflective coating (BAKC DH2333-42, a bottom anti-reflective coating with the binder material being an aliphatic triepoxy/(9-anthracenecarboxylic acid:1-adamantane carboxylic acid (1/1 mole)) adduct) was 193-nm imaged and then processed. The SEM photos of cross-sections showed 80-nm, 1:1 L/S, with a small amount of scum between the lines. The data is shown in FIG. 7.

Example 10B

1. Formulation of Middle Layer

About 1.384 g (7.47 mmol hydroxyl) of octahydroxypropyldimethylsilyl polyhedral oligomeric silsesquioxane, 61.0 g of PGMEA, 402.1 mg of POWDERLINK 1174, 100.5 mg of bisphenol A, 5.9 mg TSA, and 16.8 mg of CYMEL 303LF were stirred to give a solution. The solution was deionized by tumbling with 3.1 g of PGME-washed 650C beads for 4 hours. The beads were removed by straining through two layers of plastic cloth. The middle layer composition was then twice filtered through a 0.1-μm end-point filter.

2. Film Properties

The composition was spin-coated at 850 rpm for 60 seconds onto silicon wafers and cured at 205° C. for 60 seconds with hotplate vacuum. Film thickness was 614 Å, with a slight amount of smoke noted during the hotplate bake. Visual coat quality was excellent, but under the microscope many dark pinpoints were observed. Ethyl lactate stripping was +0.31%, i.e., slight swelling. Under the microscope, the stripped wafer still showed the pinpoint defects. Application/cure on quartz wafers, under identical conditions gave a 193-nm OD of 2.3.

3. Spin Bowl Compatibility

Spin bowl compatibility testing was carried out with the following six solvents: PGMEA, cyclohexanone, ethyl lactate, acetone, 2-heptanone, and PGME. Re-dissolution of the dried film varied between 95% and 98%. Thus, this CYMEL 303LF-containing middle layer variant was highly spin bowl compatible.

4. Plasma Etching the Cured Film on a Silicon Substrate

Using a Trion etcher with $O_2$ as the etching gas, the middle layer prepared in Part 2 of this example etched at about one quarter of the speed of the alkyl silane standard (hard mask DH2333-29). Etching selectivity to the bottom anti-reflective coating (described in Example 10A) in an $O_2$ plasma was 1:31.5. Using $CF_4$ as the etching gas in the same etcher gave a selectivity of 1:1.

5. Trilayer Lithography

A trilayer stack comprised of a thin layer (200 nm) of resist (GARS8107A10) on top of a 630-Å layer of the middle layer prepared in Part 1 of this example, on top of a bottom anti-reflective coating (with the binder material being an aliphatic, multi-functional epoxy/9-anthracenecarboxylic acid adduct) was 193-nm imaged and then processed. The SEM photo of the cross-sections showed 80-nm, 1:1 L/S, with a 0.6 μm DOF. The spaces between the lines were relatively clean.

What is claimed is:

1. In a composition for use in microlithographic processes, wherein the composition comprises an acid and a constituent dissolved or dispersed in a solvent system, said constituent being selected from the group consisting of polymers, compounds, and mixtures thereof, the improvement being that said polymer includes recurring monomers comprising a polyhedral oligomeric silsesquioxane having an alcohol functionality and that said compound comprises a polyhedral oligomeric silsesquioxane having an alcohol functionality, said composition further comprising a cross-linking agent, wherein said composition is non-photoimageable.

2. The composition of claim 1, wherein said constituent has the formula

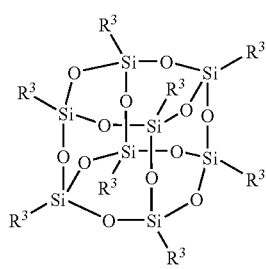

wherein each $R^3$ is individually selected from the group consisting of hydrogen, alkyls, aryls, hydroxypropyldimethylsilyloxy, and olefinic moieties.

3. The composition of claim 2, wherein said constituent is a compound having the formula

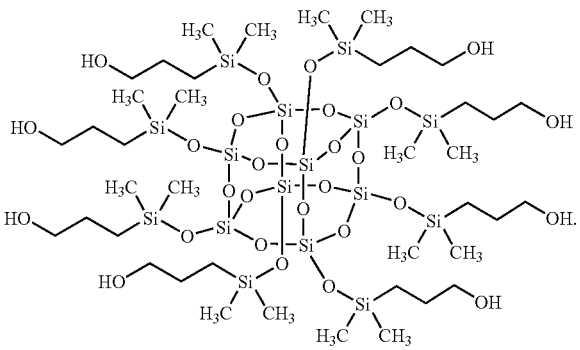

4. The composition of claim 2, wherein at least one $R^3$ is

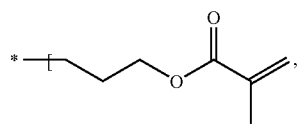

where "*" designates Si on (III).

5. The composition of claim 1, said constituent being a polymer, and said polymer further comprising recurring monomers having an alcohol functionality.

6. The composition of claim 5, said polymer comprising recurring monomers having the formula

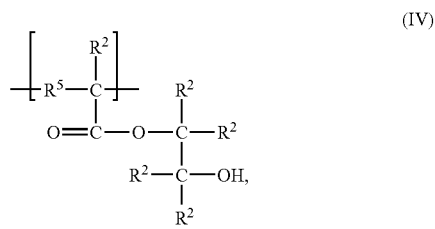

wherein each $R^2$ is individually selected from the group consisting of hydrogen, alkyls, and aryls, and each $R^5$ is individually selected from the group consisting of alkyls and aryls.

7. The composition of claim 6, wherein the molar ratio of polyhedral oligomeric silsesquioxane to (IV) is from about 15:85 to about 30:70.

8. The composition of claim 1, said composition further comprising a catalyst.

9. The composition of claim 1, wherein said cross-linking agent is selected from the group consisting of aminoplast cross-linking agents.

10. The composition of claim 8, wherein said composition comprises a weak acid and a strong acid.

11. The composition of claim 1, wherein said composition gives a spin bowl compatibility test result of at least about 90%.

12. A structure used in microlithographic processes, said structure comprising:
a substrate; and
a layer on said substrate, said layer formed from a composition comprising an acid and a constituent dissolved or dispersed in a solvent system, said constituent being selected from the group consisting of polymers, compounds, and mixtures thereof, the improvement being that said polymer includes recurring monomers comprising a polyhedral oligomeric silsesquioxane having an alcohol functionality and said compound comprises a polyhedral oligomeric silsesquioxane having an alcohol functionality, said composition further comprising a cross-linking agent, wherein said composition is non-photoimageable.

13. The structure of claim 12, said structure further comprising an anti-reflective coating between said substrate and said layer.

14. The structure of claim 12, said structure further comprising a photoresist adjacent said layer.

15. The structure of claim 13, said structure further comprising a photoresist adjacent said layer.

16. The structure of claim 12, wherein said substrate is selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal substrates.

17. The structure of claim 12, wherein said constituent has the formula

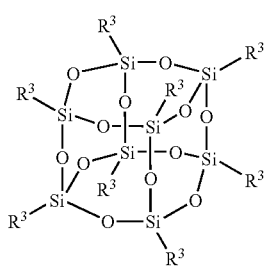

(III)

wherein each $R^3$ is individually selected from the group consisting of hydrogen, alkyls, aryls, hydroxypropyldimethylsilyloxy, and olefinic moieties.

18. The structure of claim 17, wherein said constituent is a compound having the formula

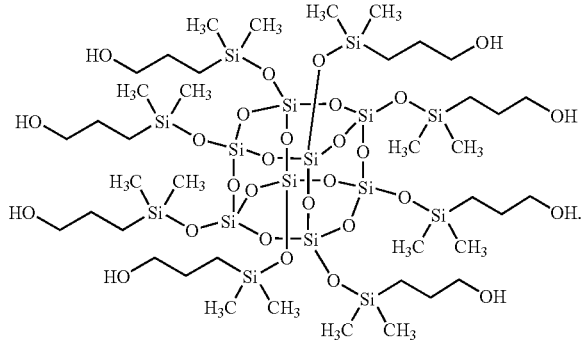

19. The structure of claim 17, wherein at least one $R^3$ is

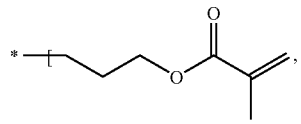

where "*" designates Si on (III).

20. The structure of claim 12, said constituent being a polymer, and said polymer further comprising recurring monomers having an alcohol functionality.

21. The structure of claim 20, said polymer comprising recurring monomers having the formula

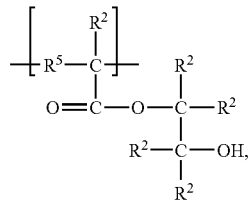

(II)

wherein each $R^2$ is individually selected from the group consisting of hydrogen, alkyls, and aryls, and each $R^5$ is individually selected from the group consisting of alkyls and aryls.

22. The structure of claim 12, said composition further comprising a catalyst.

23. The structure of claim 22, wherein said cross-linking agent is selected from the group consisting of aminoplast cross-linking agents.

24. The structure of claim 22, wherein said composition comprises a weak acid and a strong acid.

25. The structure of claim 12, wherein said layer gives a spin bowl compatibility test result of at least about 90%.

26. The structure of claim 12, wherein said layer has a thickness of less than about 2,150 Å.

27. The structure of claim 15, wherein said photoresist has a thickness of less than about 200 nm.

28. A method of forming a structure for use in microlithographic processes, said method comprising the steps of:
providing a substrate; and
forming a layer of a composition on the substrate, said composition comprising an acid and a constituent dissolved or dispersed in a solvent system, said constituent being selected from the group consisting of polymers, compounds, and mixtures thereof, the improvement being that said polymer includes recurring monomers comprising a polyhedral oligomeric silsesquioxane having an alcohol functionality and that said compound comprises a polyhedral oligomeric silsesquioxane having an alcohol functionality, said composition further comprising a cross-linking agent, wherein said composition is non-photoimageable.

29. The method of claim 28, further including the step of applying an anti-reflective coating to said substrate, and wherein said layer forming step comprises applying the layer to said anti-reflective coating.

30. The method of claim 28, further including the step of applying a photoresist to said layer.

31. The method of claim 29, further including the step of applying a photoresist to said layer.

32. The method of claim 28, wherein said substrate is selected from the group consisting of Si substrates, SiO$_2$ substrates, Si$_3$N$_4$ substrates, SiO$_2$ on silicon substrates, Si$_3$N$_4$ on silicon substrates, glass substrates, quartz substrates, ceramic substrates, semiconductor substrates, and metal substrates.

33. The method of claim 28, wherein said constituent has the formula

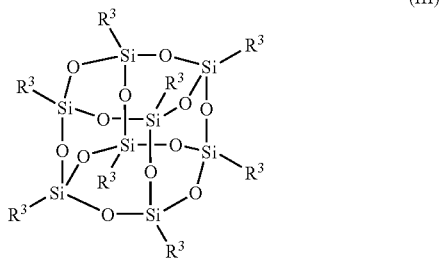

(III)

wherein each R$^3$ is individually selected from the group consisting of hydrogen, alkyls, aryls, hydroxypropyldimethylsilyloxy, and olefinic moieties.

34. The method of claim 33, wherein said constituent is a compound having the formula

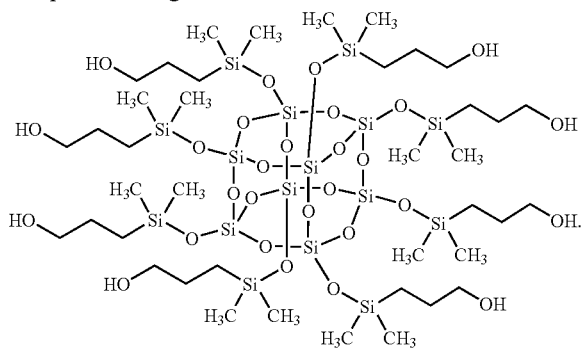

35. The method of claim 33, wherein at least one R$^3$ is

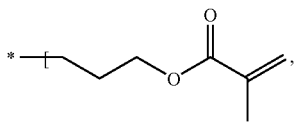

where "*" designates Si on (III).

36. The method of claim 28, said constituent being a polymer, and said polymer further comprising recurring monomers having an alcohol functionality.

37. The method of claim 36, said polymer comprising recurring monomers having the formula

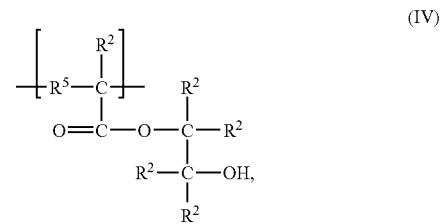

(IV)

wherein each R$^2$ is individually selected from the group consisting of hydrogen, alkyls, and aryls, and each R$^5$ is individually selected from the group consisting of alkyls and aryls.

38. The method of claim 28, said composition further comprising a catalyst.

39. The method of claim 38, wherein said cross-linking agent is selected from the group consisting of aminoplast cross-linking agents.

40. The method of claim 38, wherein said composition comprises a weak acid and a strong acid.

41. The method of claim 28, wherein said layer gives a spin bowl compatibility test result of at least about 90%.

42. The method of claim 28, further comprising the step of curing said layer, and wherein said cured layer has a thickness of less than about 2,150 Å.

43. The method of claim 30, further including the step of drying said photoresist, and wherein said dried photoresist has a thickness of less than about 200 nm.

44. The method of claim 31, further including the step of drying said photoresist, and wherein said dried photoresist has a thickness of less than about 200 nm.

45. In a composition for use in microlithographic processes, wherein the composition comprises a constituent dissolved or dispersed in a solvent system, said constituent being selected from the group consisting of polymers, compounds, and mixtures thereof, the improvement being that said polymer includes recurring monomers comprising a polyhedral oligomeric silsesquioxane and that said compound comprises a polyhedral oligomeric silsesquioxane, said composition further comprising an ingredient selected from the group consisting of cross-linking agents, catalysts, and mixtures thereof, wherein said composition comprises a catalyst, and wherein said composition comprises a weak acid and a strong acid.

46. A structure used in microlithographic processes, said structure comprising:
  a substrate;
  a layer on said substrate, said layer formed from a composition comprising an acid and a constituent dissolved or dispersed in a solvent system, said constituent being selected from the group consisting of polymers, compounds, and mixtures thereof, the improvement being that said polymer includes recurring monomers comprising a polyhedral oligomeric silsesquioxane and said compound comprises a polyhedral oligomeric silsesquioxane, wherein said composition is non-photoimageable; and
  a photoresist adjacent said layer.

47. The structure of claim 46, wherein said photoresist has a thickness of less than about 200 nm.

48. A structure used in microlithographic processes, said structure comprising:
  a substrate; and
  a layer on said substrate, said layer formed from a composition comprising a constituent dissolved or dispersed in a solvent system, said constituent being selected from the group consisting of polymers, compounds, and mixtures thereof, the improvement being that said polymer includes recurring monomers comprising a polyhedral oligomeric silsesquioxane and said compound comprises a polyhedral oligomeric silsesquioxane, wherein said composition further comprises an ingredient selected from the group consisting of cross-linking agents, catalysts, and mixtures thereof, wherein said ingredient is a cross-linking agent selected from the group consisting of aminoplast cross-linking agents, wherein said composition comprises a catalyst, and wherein said composition comprises a weak acid and a strong acid.

49. A method of forming a structure for use in microlithographic processes, said method comprising the steps of:
  providing a substrate;

forming a layer of a composition on the substrate, said composition being non-photoimageable and comprising an acid and a constituent dissolved or dispersed in a solvent system, said constituent being selected from the group consisting of polymers, compounds, and mixtures thereof, the improvement being that said polymer includes recurring monomers comprising a polyhedral oligomeric silsesquioxane and that said compound comprises a polyhedral oligomeric silsesquioxane; and applying a photoresist to said layer.

50. A method of forming a structure for use in microlithographic processes, said method comprising the steps of:

providing a substrate;

forming a layer of a composition on the substrate, said composition being non-photoimageable and comprising an acid and a constituent dissolved or dispersed in a solvent system, said constituent being selected from the group consisting of polymers, compounds, and mixtures thereof, the improvement being that said polymer includes recurring monomers comprising a polyhedral oligomeric silsesquioxane and that said compound comprises a polyhedral oligomeric silsesquioxane;

applying an anti-reflective coating to said substrate, wherein said layer forming step comprises applying the layer to said anti-reflective coating; and applying a photoresist to said layer.

51. A method of forming a structure for use in microlithographic processes, said method comprising the steps of:

providing a substrate; and forming a layer of a composition on the substrate, said composition comprising a constituent dissolved or dispersed in a solvent system, said constituent being selected from the group consisting of polymers, compounds, and mixtures thereof, the improvement being that said polymer includes recurring monomers comprising a polyhedral oligomeric silsesquioxane and that said compound comprises a polyhedral oligomeric silsesquioxane, said composition further comprising an ingredient selected from the group consisting of cross-linking agents, catalysts, and mixtures thereof, wherein said composition comprises a catalyst, and wherein said composition comprises a weak acid and a strong acid.

52. In a composition for use in microlithographic processes, wherein the composition is non-photoimageable and comprises an acid and a constituent dissolved or dispersed in a solvent system, said constituent being selected from the group consisting of polymers, compounds, and mixtures thereof, the improvement being that said polymer includes recurring monomers comprising a polyhedral oligomeric silsesquioxane and that said compound comprises a polyhedral oligomeric silsesquioxane having an alcohol functionality, wherein when said constituent is a polymer, the polymer further comprises recurring monomers having an alcohol functionality and wherein said composition further comprises a cross-linking agent.

* * * * *